United States Patent [19]

Barrett et al.

[11] Patent Number: 4,536,824
[45] Date of Patent: Aug. 20, 1985

[54] INDIRECT COOLING OF ELECTRONIC CIRCUITS

[75] Inventors: Howard W. Barrett; Paul F. Fledderjohann, both of Akron, Ohio

[73] Assignee: Goodyear Aerospace Corporation, Akron, Ohio

[21] Appl. No.: 479,222

[22] Filed: Mar. 28, 1983

[51] Int. Cl.³ ............................................. H05N 7/20
[52] U.S. Cl. ................................. 361/384; 361/388
[58] Field of Search ............................... 361/383–388; 174/15 R, 16 R, 52 FP; 165/80 C, 170; 357/82, 81

[56] References Cited

U.S. PATENT DOCUMENTS

| | | | |
|---|---|---|---|
| 2,912,624 | 11/1959 | Wagner | 361/384 |
| 3,246,689 | 4/1966 | Remde et al. | 165/170 |
| 3,651,865 | 3/1972 | Feldmanis | 361/385 |
| 4,118,756 | 10/1978 | Nelson et al. | 357/82 |
| 4,120,019 | 10/1978 | Arii et al. | 361/385 |
| 4,186,422 | 1/1980 | Laermer | 361/388 |

FOREIGN PATENT DOCUMENTS 0090727 5/1983 European Pat. Off. ............ 361/386

Primary Examiner—A. D. Pellinen
Assistant Examiner—Gregory D. Thompson
Attorney, Agent, or Firm—P. E. Milliken; L. A. Germain

[57] ABSTRACT

This invention provides for the dissipation of heat generated in integrated circuit components mounted on printed circuit boards. High conduction, low thermal resistance cooling channels are mounted between the ICs and the PC board to effect conduction cooling in conjunction with forced air convection cooling of the ICs without adding subtantially to the volume space requirements of the IC component-PC board assemblies.

4 Claims, 9 Drawing Figures

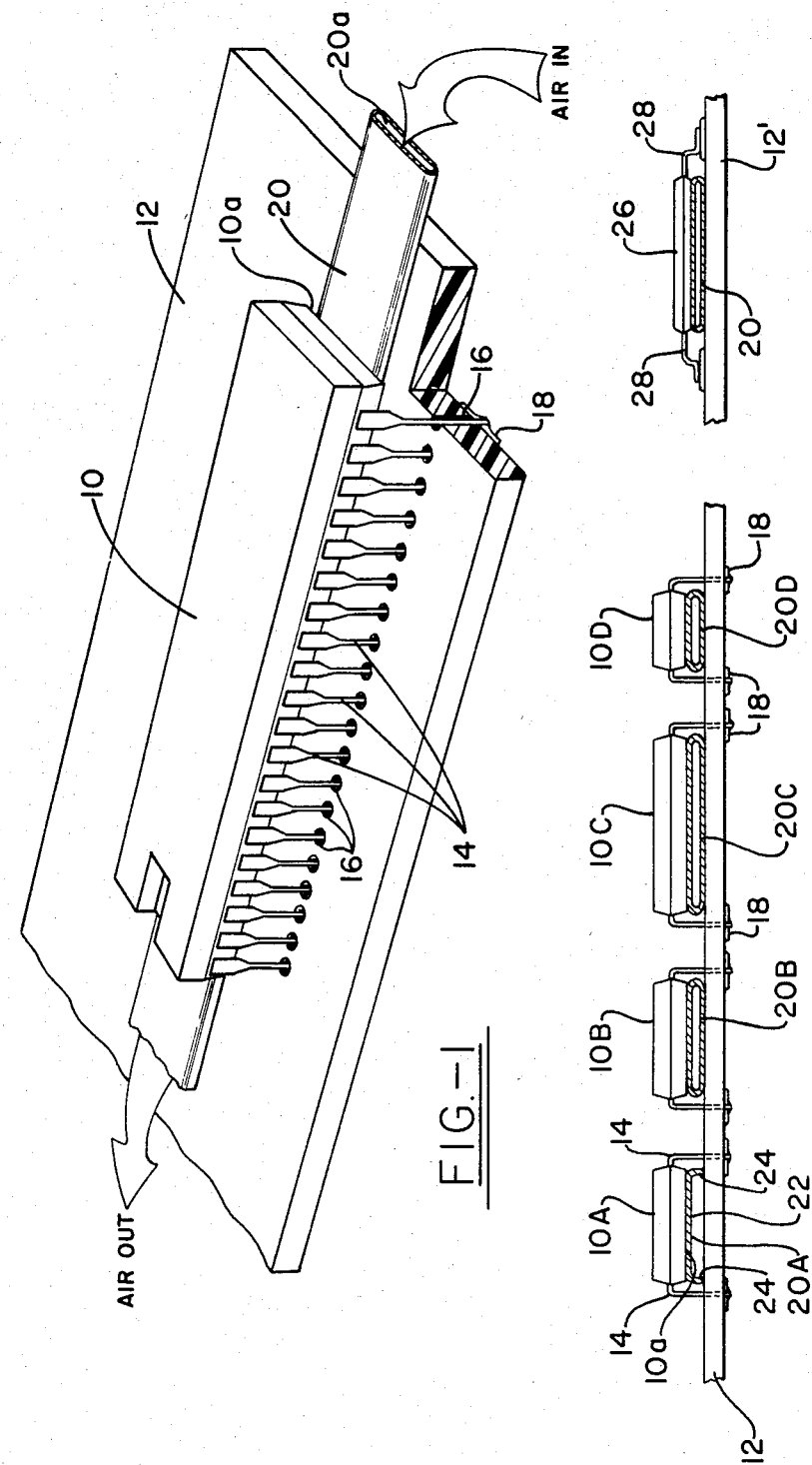

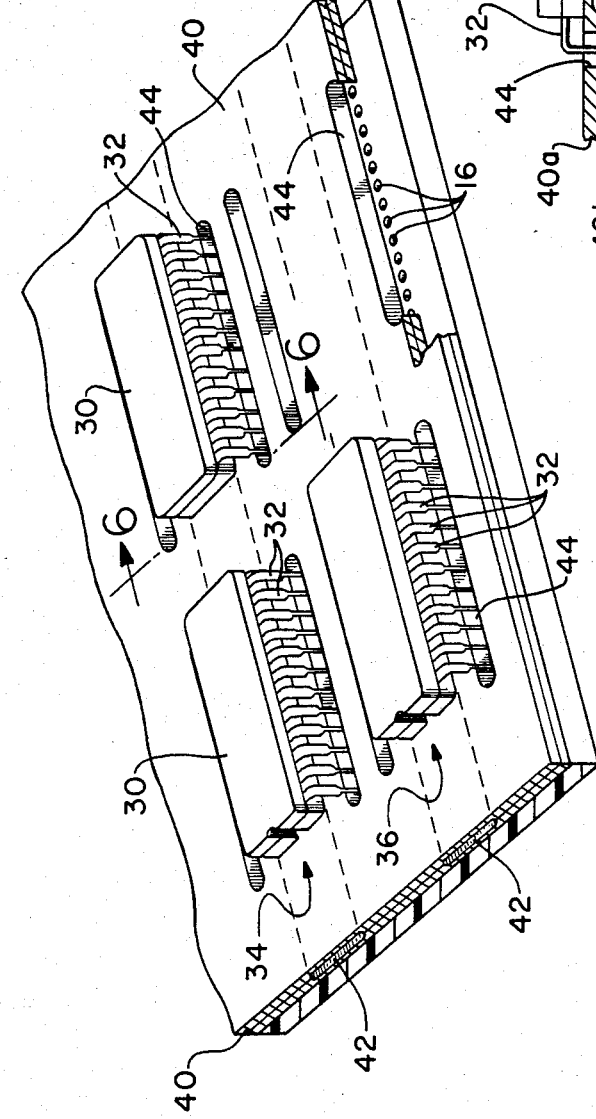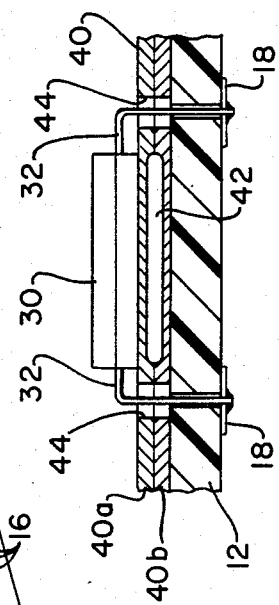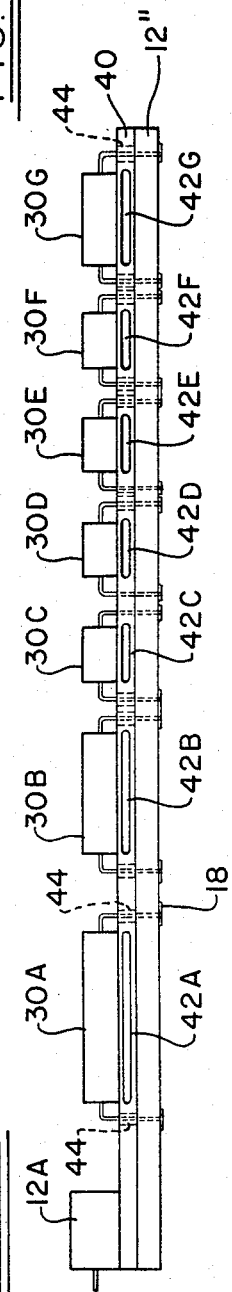

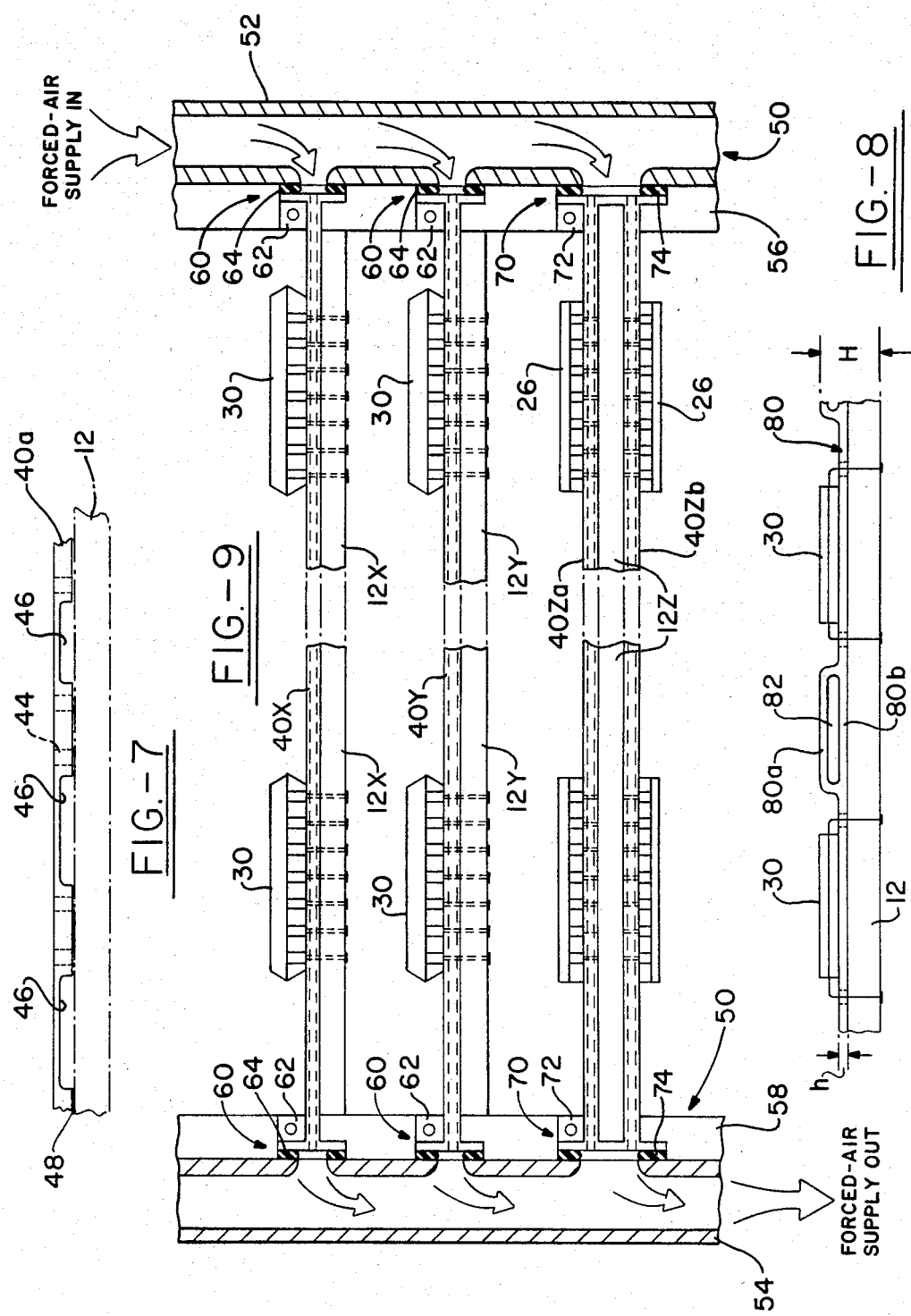

INDIRECT COOLING OF ELECTRONIC CIRCUITS

BACKGROUND OF THE INVENTION

This invention generally relates to heat dissipation relative to electronic circuits and more particularly to apparatus for cooling such circuits. More specifically, the invention is directed to apparatus for indirect forced-air cooling of integrated circuits (ICs) mounted on printed circuit (PC) boards.

It is widely known and recognized in the electronics industry that heat dissipation is a serious consideration in the design and operation of electronic apparatus. This is especially true for apparatus which comprise densely packaged electronic circuit components and in particular semi-conductor type circuit components such as integrated circuit components. It is known, for example, that to operate an IC at its full power capability there should be no temperature difference between the IC case housing and ambient air. This occurs, of course, only when the thermal resistance of the heat sink associated in the mounting of the IC is zero and then only when the existing thermal resistance is that which exists between the IC semi-conductor junction and the mounting case. It is not possible to make a heat sink with zero thermal resistance but the greater the ratio of junction-to-case versus case-to-ambient temperature the more closely the maximum power limit of the particular IC can be approached.

The effect of extreme high temperature on ICs will vary depending upon certain factors including the type of circuit, the packaging configuration, and the fabrication techniques used by the IC manufacturer. However, it can be generally stated that extreme high temperatures cause IC characteristics to change. For example, a temperature above that which is rated for a particular IC may cause one or more of the following to happen: increased leakage currents, increased sensitivity to noise, increased unbalance in balanced circuits, increased "switching spikes" or transient voltages in digital ICs, and/or increased chance of thermal runaway and ultimate destruction or burnout of the device.

Because of the importance of heat dissipation, various techniques are being applied to cooling of ICs and these include heat dissipation by conduction using high conductive metal heat sink mountings and/or heat dissipation by convection using cooling air that is blown over and around the ICs. In many applications where forced air may be available, it may not be used because the amount of air is limited and insufficient, or else the air is contaminated such as to make it unsuitable without elaborate filtering.

It is in accordance with one aspect of the present invention, an object to provide heat dissipation of electronic circuits by both conduction and convection heat transfer modes and without adding substantially to the volume space requirements of the apparatus utilizing such circuits.

According to another aspect of the invention it is an object to provide heat dissipation of integrated circuits in flat pack and/or dual-in-line (DIP) configurations when mounted on printed circuit (PC) boards.

In accordance with still another aspect of the invention, it is an object to provide heat dissipation in IC circuits mounted on PC boards using forced air convection cooling in conjunction with heat sink conduction cooling.

BRIEF DESCRIPTION OF THE DRAWINGS

FIG. 1 is a perspective view, partially broken away, of an IC in a dual-in-line package configuration as it may be mounted on a PC board in combination with the cooling apparatus of this invention;

FIG. 2 is an end elevational view showing a plurality of ICs as they may be mounted on a PC board in accordance with FIG. 1;

FIG. 3 is an end elevational view of an IC in a flat-pack package configuration as it may be mounted on a PC board and utilizing the cooling apparatus of the invention;

FIG. 4 is a perspective view, partially broken away, showing a plurality of ICs mounted on a PC board in combination with cooling apparatus forming a second embodiment of the invention;

FIG. 5 is an end elevational view of the embodiment of FIG. 4 showing a plurality of ICs as they may be mounted on a PC board;

FIG. 6 is a greatly enlarged elevational view as may be taken on lines 6—6 of FIG. 4;

FIG. 7 is an elevational view of a channeled plate for conduction and convection cooling of integrated circuit components;

FIG. 8 is an end elevational view of an IC/PC board mounting in combination with cooling apparatus forming a third embodiment of the invention; and FIG. 9 is a top view, partially in section, showing vertically mounted PC boards as they may be connected to end assemblies having forced air supply and return means as part of the PC board mounting arrangement.

DETAILED DESCRIPTION OF THE INVENTION

Referring to the drawings, an integrated circuit component 10 in a dual-in-line (DIP) package configuration is shown in FIG. 1 as it may be mounted on a printed circuit board 12. Conventionally, such ICs are mounted with their lead wires 14 positioned in holes 16 in the PC board 12 and soldered to circuit wiring 18 on the reverse side of the board 12. The IC 10 would normally have its bottom surface 10a mounted directly on the board 12 or alternatively slightly removed from the surface of the PC board so as to allow for free flow air circulation about the IC to dissipate heat generated by it. Heat dissipation may be further increased by mounting finned heat sinks of various configurations to the top of the IC 10 and/or by mounting low thermal resistance washers between the IC and PC board. The cooling may also be increased by blowing cooling air over the IC and PC board package.

According to the present invention, IC cooling is a consideration prior to its mounting on the PC board 12. As illustrated in the drawing, a cooling channel 20 is positioned between the IC 10 and the PC board 12. The IC is mounted on the channel 20 with its bottom surface 10a in contact with the channel 20 while the lead wires 14 are soldered in place on the reverse side of the PC board 12. The channel 20 defines a tubular shape having a bore 20a as shown in the drawing and it is constructed of a high conductive metal such as copper or aluminum which exhibit low thermal resistance. The heat generated in the IC is transferred to the channel 20 via conduction and the cooling efficiency is increased by passing cooling air through the channel bore 20a such that convection cooling is effected.

In FIG. 2, a plurality of ICs 10A–10D are shown mounted on a PC board 12 and each IC has an associated cooling channel 20A–20D positioned between it and the PC board 12. It will be noted that the channels 20A–20D are approximately as wide as the particular IC so that maximum contact is made between the two but not so wide as to cause shorting out of the lead wires 14 through the metal of the channels 20. For example, the channel 20C associated with IC 10C is obviously wider than the channel 20D associated with IC 10D. In either case the channel is only as wide as the IC case housing.

For maximum thermal efficiency the channels 20 will be of a tubular shape as shown in FIG. 1, however, they may in some applications be configured in an inverted U-shape as shown in FIG. 2 at IC 10A. In this configuration, the closed end 22 of the channel 20A is adjacent the IC bottom surface 10a while the open end faces the PC board and the channel bore 20a is defined by the legs 24 of the U-shape. The channels 20 will normally be adhesively secured to the PC board 12 to eliminate the possibility of shorting the lead wires in the metal channels by their shifting or moving which could occur in some applications. In the embodiment of channel 20A, the adhesive attachment will also serve to seal the legs 24 against the board 12 and eliminate air leakage out of the channel.

FIG. 3 illustrates the application of the invention to a "flat-pack" IC configuration 26 wherein the lead wires 28 are soldered to the same side surface of a PC board 12' as the flat-pack rather than to the opposite side as shown in FIG. 2. In this configuration, the channel 20 effects heat dissipation from the IC 26 while being positioned so as not to interfere with PC board circuit operations.

In FIG. 4, a second embodiment of the invention is illustrated wherein a plurality of ICs 30 are mounted on a PC board 12 and heat dissipation is accomplished via a plate 40 that is positioned between the ICs 30 and the PC board 12. The plate 40 is made of high conductive, low thermal resistance metal and is characterized by a plurality of channels or bores 42 that are in longitudinal alignment with a particular row 34, 36 of ICs 30 as they are mounted on the PC board. The width of each bore 42 is substantially the width of the particular ICs to be cooled such that heat generated by the ICs is transferred to the metal plate 40 via conduction and cooling air that is passed through the bore 42 effects heat dissipation via convection to increase the thermal efficiency of the plate. So that the ICs 30 may be mounted to the PC board 12 without shorting out in the metal of the plate 40, a plurality of parallel aligned slots 44 are provided on either side of a bore 42 so that IC lead wires 32 may pass unobstructed to the board. The slots 44 are etched, stamped out of or otherwise machined in the plate 40 and are of sufficient width such that the lead wires do not make physical contact with the plate.

FIG. 5 is an elevational view of a PC board 12" showing the arrangement of ICs 30 in relation to the plate 40 and the bores 42. The PC board 12" is characterized by a plurality of rows of ICs 30A–30G of varying sizes and these are soldered or otherwise connected to printed wiring 18 on the opposite side of the board. The printed circuit 18 is terminated in a conventional connector 12A at one end thereof and the total package may be vertically mounted in a housing via edge connectors (not shown). The plate 40 is specifically designed for this particular arrangement of ICs 30A–30G and it will be noted that the bores 42A–42G are of differing widths corresponding to the sized of ICs 30A–30G.

The plate 40 is made in two matching halves 40a and 40b as illustrated in FIG. 6. The bores 42 may be machined or chemically etched into a solid metal sheet and the arrangement of the plurality of bores 42 will conform to the arrangement of the ICs on the PC board as shown in FIG. 5. The two plate halves 40a and 40b are bonded together to form the bore configuration and then the integral plate is secured to the PC board by various means including adhesives, screws etc. This embodiment of the invention is advantages in those applications where vibration may be a problem inasmuch as the integral plate-PC board configuration provides an effective vibration damper for the PC board package.

While the bores 42 and slots 44 are effective in reducing the overall weight of the plate 40, a further reduction may be realized by eliminating the bottom 40b of the plate as shown in FIG. 7. For example, for the same gauge thickness of plate 40, the bores may be machined as open channels 46 in the bottom of the plate. Because the plate is secured to the PC board, the bores 42 are created by the channels 46 as between the PC board surface and the plate. When an adhesive 48 is used to bond the plate to the PC board this also seals the channels 46 against air loss due to any roughness in the surface of the PC board. This technique reduces the thermal efficiency of the plate somewhat and will be useful in applications where weight is a critical factor.

FIG. 8 illustrates an embodiment of the invention wherein the overall weight and height of the cooling apparatus is further reduced. In this embodiment ICs 30 are mounted on a PC board 12 and cooled by a heat sink metal plate 80. In contrast to the embodiment of FIG. 4 the heat sink 80 has a very low cross-sectional height "h" beneath the IC components and the heat dissipation is increased by a channel passage 82 positioned between the components 30. In this configuration the overall height "H" is considerably reduced while the channel passage 82 may be increased to the extent that the top of the channel 80a does not exceed the top height of the components 30. It is anticipated that the channel passages 82 may be formed in various ways. For example, a flat plate heat sink 80 may be mounted on the PC board 12 and channel tubes 20 as shown in FIG. 1 may be positioned on the plate between rows of IC components 30. Alternatively, the channels 82 may be formed of top and bottom halve portions 80a and 80b respectively, in the manner illustrated in FIG. 6. Further, the flat plate 80 may be formed with open channels 82 in the manner of FIG. 7 by a metal forming press. In this configuration, the plate 80 is adhesively secured to the board 12 and the channels are formed as between the top of the channel 80a and the surface of the board 12 and air passage is restricted to the channel passage 82.

FIG. 9 illustrates the manner of mounting the PC board package in end assemblies generally indicated at 50. The assemblies 50 are comprised of an inlet air passage member 52 and an outlet air passage member 54 and these are secured to slotted PC board mounting units 56 and 58 respectively. The units 56 and 58 are conventional PC board or card mounting units but they are modified to accept the cooling plates 40 in an air sealing arrangement as illustrated in the drawing at reference numeral 60. Three PC boards 12X, 12Y, and 12Z are shown in their vertical mounting positions between the air inlet and outlet passage members 52 and 54. PC boards 12X and 12Y have a plurality of DIP components 30 mounted thereon in the manner of FIG. 4 and channeled plates 40X and 40Y are provided for conduction and forced air convection cooling of the ICs. The PC board assemblies are connected into a cam-lock mechanism 62 and the plates 40X and 40Y are air sealed by O-ring type seals 64.

PC board 12Z is a multi-layered board of conventional manufacture but it is modifid by securing channeled cooling plates 40Za and 40Zb to opposite face surfaces of the board. A plurality of flat pack type ICs 26 are mounted on the board in the manner of FIG. 6 and the heat generated by the ICs is dissipated by conduction and forced air convection cooling in the respective plates. The end assemblies 50 are modified to accomodate the two plate arrangement such as illustrated at reference numeral 70 and this includes a cam-lock 72 and an O-ring seal 74.

From the foregoing it will be appreciated that the invention provides heat dissipation in IC components mounted on PC boards wherein the boards and/or printed wiring circuits are not exposed to contamination by unfiltered air. In this respect, it will also be appreciated that the channelled low thermal resistance plates effect a high cooling efficiency without adding substantially to the volume space requirements of the PC board mounting arrangement.

While various embodiments of the invention have been illustrated and described in detail, it is to be understood that the invention is not limited thereto or thereby, but that various modifications may become apparent to those persons skilled in the art and these are considered to fall within the scope of the appended claims.

What is claimed is:

1. Apparatus for indirect cooling of electronic IC components comprising in combinaton:
    a printed circuit board;
    a plurality of IC components mounted to the printed circuit board by lead wires connected into said board, said IC components oriented in a plurality of parallel rows on the printed circuit board;
    a source of forced air;
    a plate positioned between the printed circuit board and the IC components, said plate comprising a low thermal resistance, high heat conduction material defining parallel channel passages between the rows of IC components and in intimate contact beneath the IC components to provide conduction heat transfer from the ICs during operation; and
    means mounted at each end of the printed circuit board to hold the board in a predetermined orientation and defining an input channel passage at one end of the board and an output channel passage at the opposite end thereof, the input channel passage being connected to the source of forced air and each of said channel passages being interconnected between the input and output channel passages such that forced air passing through the passages provides increased heat transfer by convection within the channel passages.

2. The apparatus as set forth in claim 1 wherein the channel passages are formed as an integral part of the plate.

3. The apparatus as set forth in claim 2 wherein the channel passages are formed as open channels and the height of each channel passage is no greater than the height of the highest IC component mounted on the printed circuit board.

4. Apparatus for indirect cooling of electronic IC components mounted via their connecting lead wires to a printed circuit board comprising in combination:
    a flat plate of high conduction, low thermal resistance material positioned between the printed circuit board and the IC components, said plate having a plurality of open channels formed in one face surface thereof, which face surface is adhesively secured to the printed circuit board such that the contacting relationship between the two defines closed channel passages, each said passage being oriented beneath a row of IC components and having a width substantially corresponding to a width of the widest IC but less than the distance between the lead wires from one side of the IC to the opposite side thereof, said plate having slots through the total thickness on either side of a channel passage such that the IC lead wires pass through the plate without making physical contact therewith and each said IC component being in intimate contact with the plate material to provide a conduction heat transfer path from the IC component to the plate;
    a source of forced cooling air;
    an input channel mounted along one side of the printed circuit board and connected to the source of cooling air and to each of said channel passages in the plate; and
    an output channel mounted along the opposite side of the printed circuit board and connected to each of said channel passages in the plate and providing an exit path for the cooling air;
    said input channel, plate channel passages, output channel, forced cooling air and low thermal resistance material of the plate providing both conduction and convection transfer paths for heat generated by the IC components.

* * * * *